(12) United States Patent
Park

(10) Patent No.: US 6,919,963 B2
(45) Date of Patent: Jul. 19, 2005

(54) APPARATUS FOR DETECTING WAVELENGTH DRIFT AND METHOD THEREFOR

(75) Inventor: Christopher Anthony Park, Stowmarket (GB)

(73) Assignee: Agilent Technologies, Inc., Palo Alto, CA (US)

( * ) Notice: Subject to any disclaimer, the term of this patent is extended or adjusted under 35 U.S.C. 154(b) by 226 days.

(21) Appl. No.: 10/325,178

(22) Filed: Dec. 20, 2002

(65) Prior Publication Data
US 2003/0123066 A1 Jul. 3, 2003

(30) Foreign Application Priority Data
Dec. 21, 2001 (EP) .............................................. 01310792

(51) Int. Cl.[7] ................................................ G01B 9/02
(52) U.S. Cl. ........................................ 356/484; 372/32
(58) Field of Search .............................. 356/484, 450, 356/451, 454, 477, 521; 372/32

(56) References Cited

U.S. PATENT DOCUMENTS 5,002,395 A  *  3/1991  Shah ........................... 356/484

FOREIGN PATENT DOCUMENTS

| JP | 57037893 | 3/1982 |
| JP | 57190387 | 11/1982 |
| JP | 62171174 | 7/1987 |
| JP | 63317935 | 12/1988 |
| JP | 07115248 | 5/1995 |
| WO | WO 01/11739 A1 | 2/2001 |

OTHER PUBLICATIONS

Claessen, L., Examiner. European Search Report, Application No. EP 01 31 0792, dated Dec. 5, 2002.

* cited by examiner

*Primary Examiner*—Andrew H. Lee

(57) ABSTRACT

A laser wavelength locking control loop apparatus comprising a wavelength selective device and a photodetector, coupled to a feedback controller circuit. Electromagnetic radiation emitted by the laser device is provided to the wavelength selective device which provides a first output signal at a first wavelength and a second output signal at a second wavelength. The first and second output signals are directed to the photodetector so as to coincide when incident thereupon. A beat signal results from the coincidence of the first and second output signals and this is used to measure wavelength drift.

8 Claims, 1 Drawing Sheet

APPARATUS FOR DETECTING WAVELENGTH DRIFT AND METHOD THEREFOR

FIELD OF THE INVENTION

The present invention relates to an apparatus for detecting wavelength drift of the type used to generate an error signal for the purpose of controlling a wavelength of an electromagnetic signal emitted by a laser device. The present invention also relates to a method of detecting wavelength drift.

DISCUSSION OF THE BACKGROUND ART

In an optical communications network, the wavelength of electromagnetic radiation used to communicate a signal is an important parameter. In particular, where Wavelength Division Multiplexing (WDM) systems are employed, different signals are respectively communicated using different wavelengths, each different wavelength being known as a channel. Typically, an array of semiconductor laser devices will be employed in a transmitter unit of the WDM system in order to transmit electromagnetic signals over a range of different wavelengths. In addition, or alternatively, a tunable semiconductor laser device capable of transmitting electromagnetic signals over a range of different wavelengths can be employed in the transmitter unit. Each channel corresponding to each laser device (or the tunable laser device) is separated from an adjacent channel by a set wavelength separation. For example, on an ITU grid, the wavelength separation between adjacent channels is 0.8 nm, which corresponds to a frequency separation of 100 GHz.

In WDM systems, the different electromagnetic signals on different channels are combined into a single transmission stream by a multiplexer which enables the different electromagnetic signals on the different channels of respective different wavelengths to be transmitted through a single optical fibre simultaneously. A demultiplexer is then used to separate out the different wavelengths corresponding to the electromagnetic signals onto individual optical fibres, each optical fibre consequently carrying electromagnetic radiation of a differing wavelength corresponding to a particular channel.

Laser devices employed in transmitters in a WDM system can exhibit wavelength drift as a result of a change in temperature of the laser device. Wavelength drift may result in a laser device transmitting an electromagnetic signal at a predominantly incorrect wavelength and therefore cause adjacent wavelength channels to overlap. The overlapping of adjacent wavelength channels is known as cross-talk and causes problems in the accurate multiplexing and demultiplexing of the electromagnetic signals in the WDM system. In order to monitor and control the wavelength drift of a laser device it is known to employ a wavelength dependant element in a closed feedback circuit. The wavelength dependant element can employ interference or dispersion to provide wavelength dependence. In relation to the use of interference, one known apparatus employing a Fabry-Perot etalon in a closed feedback circuit is disclosed in U.S. Pat. No. 5,825,792.

SUMMARY OF THE INVENTION

According to a first aspect of the present invention, there is provided an apparatus for detecting wavelength drift of a source of electromagnetic radiation, the apparatus characterized by: a wavelength selective device for receiving electromagnetic radiation from the source of electromagnetic radiation and providing electromagnetic radiation of a first wavelength and electromagnetic radiation of a second wavelength from the source of electromagnetic radiation, the first and second wavelengths of electromagnetic radiation being separated by a predetermined wavelength spacing; a sensor for coincidently receiving the electromagnetic radiation of the first wavelength and the electromagnetic radiation of the second wavelength; and means for measuring a beat signal resulting from the coincidence of the electromagnetic radiation of the first and second wavelengths, the magnitude of the beat signal being an indication of an amount of wavelength drift of the source of electromagnetic radiation.

Preferably, the wavelength selective device is athermal or characterised, i.e. the characteristics of the wavelength selective device are known.

According to a second aspect of the present invention, there is provided a communications network comprising the apparatus as set forth above in relation to the first aspect of the present invention.

According to a third aspect of the present invention, there is provided a Wavelength Division Multiplexing (WDM) system comprising the apparatus as set forth above in relation to the first aspect of the present invention.

According to a fourth aspect of the present invention, there is provided a method of detecting wavelength drift of a source of electromagnetic radiation, the method comprising the steps of: selecting electromagnetic radiation of a first wavelength and electromagnetic radiation of a second wavelength from the source of electromagnetic radiation, the first and second wavelengths being separated by a predetermined wavelength spacing; directing the electromagnetic radiation of the first and second wavelengths so as to coincide; and measuring a beat signal resulting from the coincidence of the electromagnetic radiation of the first and second wavelengths, the magnitude of the beat signal being indicative of an amount of wavelength drift of the source of electromagnetic radiation.

Preferably, the electromagnetic radiations of the first and second wavelengths are directed to coincide and be incident upon a sensor of electromagnetic radiation.

According to a fifth aspect of the present invention, there is provided a method of controlling wavelength drift of a source of electromagnetic radiation, the method comprising: the steps of detecting wavelength drift of the source of electromagnetic radiation as set forth above in relation to the first aspect of the present invention, and generating a control signal to alter a parameter of the source of electromagnetic radiation so as to maintain electromagnetic radiation from the source of electromagnetic radiation at a predetermined wavelength.

According to a sixth aspect of the present invention, there is provided a use of a beat signal to determine an amount of wavelength drift of a source of electromagnetic radiation.

It should be appreciated that the invention is particularly, but not exclusively, applicable to wavelengths of electromagnetic radiation between about 300 nm and 10 µm, preferably between about 400 nm and 2 µm, and very preferably between about 800 nm and about 1700 nm.

It is thus possible to provide an apparatus for detecting wavelength drift and a method therefore that can be integrated into a control loop apparatus for monitoring and controlling cross-talk between adjacent channels. Improved control of wavelength drift is also thus possible without the need for complicated arrangements incorporating optical components. Furthermore, fewer components are required to detect wavelength drift and hence a more compact apparatus can be produced. Cost is also clearly also reduced due to the need for fewer components.

BRIEF DESCRIPTION OF THE DRAWINGS

At least one embodiment of the present invention will now be described, by way of example only, with reference to the accompanying drawing, in which.

DETAILED DESCRIPTION OF THE PREFERRED EMBODIMENT

Figure 1:
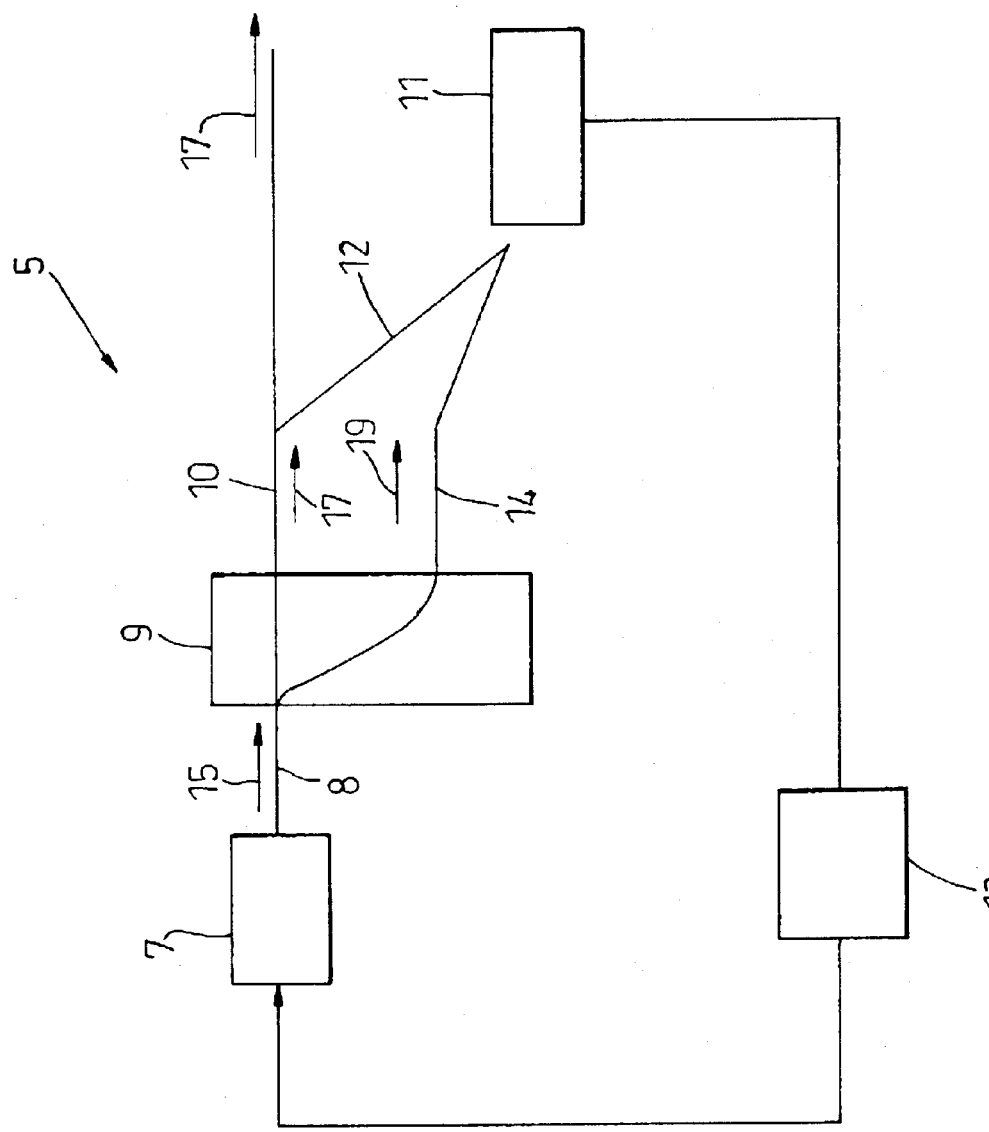
FIG. 1 is a schematic diagram of a laser wavelength locking control loop apparatus constituting an embodiment of the present invention.

Referring to FIG. 1, a laser wavelength locking control loop apparatus 5 comprises a laser device 7, for example a tunable semiconductor laser coupled by, for example, a first optical fibre 8 to an input port of an athermal wavelength selective device 9 such as an athermal Arrayed Waveguide Grating (AWG) as disclosed in the publication, "Athermal polarization—independent all-polymer arrayed waveguide grating (AWG) multi/demultiplexer" by Keil et al, OFC PD7, 2001". A first end of a second optical fibre 10 is coupled to a first output port and a first end of a third optical fibre 14 is coupled to a second output port of the wavelength selective device 9. A 90/10 splitter (not shown) is coupled to the second optical fibre 10 and a first end of a fourth optical fibre 12 is coupled to the 90/10 splitter. A second end of the third optical fibre 14 and a second end of the fourth optical fibre 12 are disposed close to a detector 11, such as a photodetector. The detector 11 is coupled to a feedback controller circuit 13 which can be, but is not limited to, a controller. The feedback controller circuit 13 is coupled to the laser device 7.

In operation, the laser device 7 transmits a first electromagnetic signal 15 on a first channel, the first channel having a first central wavelength $\lambda_C$ and a bandwidth $\lambda_B$. The first electromagnetic signal 15 is transmitted at, for example, a predetermined designated wavelength having a peak, central wavelength $\lambda_1$ within a spread of wavelengths $\Delta\lambda$. The first electromagnetic signal 15 propagates to the wavelength selective device 9 which separates out and directs wavelengths about the first central wavelength $\lambda_1$ of the first channel having the spread of wavelengths $\Delta\lambda$ into the second optical fibre 10 and wavelengths centered about a second channel, a predetermined channel spacing from the first channel, for example 0.8 nm, into the fourth optical fibre 12, thereby providing a high degree of spatial isolation between adjacent channels. The spacing between adjacent channels is, in this example, 0.8 nm, but can be smaller if a greater degree of accuracy in the detection of cross-talk is required. The output from the wavelength selective device 9 comprises, on the first channel, a first output signal 17 corresponding to the desired wavelength $\lambda_1$ with a power $P_1$ and, assuming some wavelength drift has occurred, a second output signal 19 on a second, adjacent, channel with a power $P_2$ where the power $P_2$ of the second output signal 19 is a small signal given by cross-talk.

When the laser device 7 is operating at the predetermined designated wavelength, the central wavelength $\lambda_1$ substantially matches the first central wavelength $\lambda_C$ of the channel and the spread of wavelengths $\Delta\lambda$ are such that substantially all the wavelengths $\Delta\lambda$ forming the spectral distribution of the first electromagnetic signal 15 substantially fall within the bandwidth $\lambda_B$ of the first channel. When the laser device 7 is not operating at the predetermined designated wavelength due to a wavelength drift, the central wavelength $\lambda_1$ does not substantially match the first central wavelength $\lambda_C$ of the channel and the spread of wavelengths $\Delta\lambda$ are such that some of the wavelengths in the spread of wavelengths $\Delta\lambda$ forming the spectral distribution of the first electromagnetic signal 15 impinge upon adjacent channels causing cross-talk due to the laser device 7 transmitting the first electromagnetic signal 15 at an incorrect wavelength.

On exiting the wavelength selective device 9, the first output signal 17 is split by the 90/10 splitter to enable a proportion of the first output signal 17 to be received by the detector 11 whilst the remainder of the first output signal 17 continues along its propagation path to, for example, a multiplexer device. The second output signal 19 is also received by the detector 11 and at the detector 11 the first output signal 17 and the second output signal 19 are coincident so as to combine.

As a result of the combination of the first output signal 17 and the second output signal 19 on the detector, a homodyne beat signal is produced having an intensity, $I_{beat}$ proportional to the square root of the product $(P_1P_2)$, where $P_1$ and $P_2$ are as defined above. The homodyne beat signal can be used as an indicator of the amount of cross-talk and hence the wavelength drift of the laser device 7 as shown in the following examples.

Typically for ITU channel spacings of 0.8 nm, the cross-talk between adjacent wavelength channels is −20 dB ($\frac{1}{100}^{th}$) of the power $P_1$ of the peak signal. Given a power $P_1$ of the first electromagnetic signal 15 of 1 mW (0 dBm) and therefore a cross-talk of 0.01 mW (−20 dBm) comprising $P_2$, the homodyne beat signal is produced with an intensity 0.1 mW (−10 dBm).

If the wavelength of the laser device 7 drifts such that the power $P_1$ falls to 0.98 mW (−0.1 dBm) and the power $P_2$ of the cross-talk consequently increases to, for example, 0.1 mW (−10 dBm), then the homodyne beat signal will have an intensity of 0.3 mW (−5 dBm) which would indicate an increase in cross-talk between adjacent channels and thus the presence of wavelength drift of the laser device 7. Thus the homodyne beat signal can be used as a sensitive monitor of the degree of cross-talk and hence wavelength drift of the laser device 7.

In response to the homodyne beat intensity, the detector 11 outputs a feedback signal in the form of a current to the feedback controller circuit 13. The feedback controller circuit 13 generates an error signal of substantially zero value in response to the feedback signal output by the detector 11 if the homodyne beat signal is below a specified threshold value, for example 0.1 mw (−10 dBm). The feedback controller circuit 13 generates an error signal of non-zero value in response to the feedback signal output by the detector 11 if the homodyne beat signal is above or equal to the specified threshold value. The error signal generated by the feedback controller circuit 13 is processed by the feedback controller circuit 13 in order to generate a control signal for altering a parameter of the laser device 7, such as temperature, in order to control the wavelength of the first electromagnetic signal 15. Consequently, the above laser wavelength locking control loop apparatus 5 ensures that the laser device 7 emits the first electromagnetic signal 15 at the desired wavelength $\lambda_1$ and that the spread of wavelengths $\Delta\lambda$ comprising the first electromagnetic signal 15 remain within the designated channel therefore substantially eliminating cross-talk.

What is claimed is:

1. An apparatus for detecting wavelength drift of a source of electromagnetic radiation, the apparatus comprising:
    a wavelength selective device for receiving electromagnetic radiation from the source of electromagnetic radiation and providing electromagnetic radiation of a first wavelength and electromagnetic radiation of a second wavelength from the source of electromagnetic radiation, the first and second wavelengths of electromagnetic radiation being separated by a predetermined wavelength spacing;
    a sensor for coincidently receiving the electromagnetic radiation of the first wavelength and the electromagnetic radiation of the second wavelength; and
    a circuit for measuring a beat signal resulting from the coincidence of the electromagnetic radiation of the first and second wavelengths, the magnitude of the beat signal being an indication of an amount of wavelength drift of the source of electromagnetic radiation.

2. An apparatus as claimed in claim 1, wherein the wavelength selective device is athermal or characterised.

3. A communications network comprising an apparatus for detecting wavelength drift of a source of electromagnetic radiation, the apparatus comprising:
    a wavelength selective device for receiving electromagnetic radiation from the source of electromagnetic radiation and providing electromagnetic radiation of a first wavelength and electromagnetic radiation of a second wavelength from the source of electromagnetic radiation, the first and second wavelengths of electromagnetic radiation being separated by a predetermined wavelength spacing;
    a sensor for coincidently receiving the electromagnetic radiation of the first wavelength and the electromagnetic radiation of the second wavelength; and
    a circuit for measuring a beat signal resulting from the coincidence of the electromagnetic radiation of the first and second wavelengths, the magnitude of the beat signal being an indication of an amount of wavelength drift of the source of electromagnetic radiation.

4. A wavelength division multiplexing system comprising an apparatus for detecting wavelength drift of a source of electromagnetic radiation, the apparatus comprising:
    a wavelength selective device for receiving electromagnetic radiation from the source of electromagnetic radiation and providing electromagnetic radiation of a first wavelength and electromagnetic radiation of a second wavelength from the source of electromagnetic radiation, the first and second wavelengths of electromagnetic radiation being separated by a predetermined wavelength spacing;
    a sensor for coincidently receiving the electromagnetic radiation of the first wavelength and the electromagnetic radiation of the second wavelength; and
    a circuit for measuring a beat signal resulting from the coincidence of the electromagnetic radiation of the first and second wavelengths, the magnitude of the beat signal being an indication of an amount of wavelength drift of the source of electromagnetic radiation.

5. A method of detecting wavelength drift of a source of electromagnetic radiation, the method comprising:
    selecting electromagnetic radiation of a first wavelength and electromagnetic radiation of a second wavelength from the source of electromagnetic radiation, the first and second wavelengths being separated by a predetermined wavelength spacing;
    directing the electromagnetic radiation of the first and second wavelengths so as to coincide; and
    measuring a beat signal resulting from the coincidence of the electromagnetic radiation of the first and second wavelengths, the magnitude of the beat signal being indicative of an amount of wavelength drift of the source of electromagnetic radiation.

6. A method as claimed in claim 5, wherein the electromagnetic radiation of the first and second wavelengths are directed to coincide and be incident upon a sensor of electromagnetic radiation.

7. A method of controlling wavelength drift of a source of electromagnetic radiation, the method comprising:
    detecting wavelength drift of the source of electromagnetic radiation comprising: selecting electromagnetic radiation of a first wavelength and electromagnetic radiation of a second wavelength from the source of electromagnetic radiation, the first and second wavelengths being separated by a predetermined wavelength spacing; directing the electromagnetic radiation of the first and second wavelengths so as to coincide; and measuring a beat signal resulting from the coincidence of the electromagnetic radiation of the first and second wavelengths, the magnitude of the beat signal being indicative of an amount of wavelength drift of the source of electromagnetic radiation, and
    generating a control signal to alter a parameter of the source of electromagnetic radiation so as to maintain electromagnetic radiation from the source of electromagnetic radiation at a predetermined wavelength.

8. A method comprising measuring a beat signal to determine an amount of wavelength drift of a source of electrical radiation.

* * * * *